United States Patent
Eng et al.

(10) Patent No.: US 6,678,301 B1
(45) Date of Patent: Jan. 13, 2004

(54) APPARATUS AND METHOD FOR MINIMIZING WAVELENGTH CHIRP OF LASER DEVICES

(75) Inventors: Lars E. Eng, Upper Macungie, PA (US); Robert Louis Hartman, Warren Township, Somerset County, NJ (US); Gleb E. Shtengel, Upper Milford Township, Lehigh County, PA (US); Daniel Paul Wilt, Orefield, PA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 0 days.

(21) Appl. No.: 09/616,537

(22) Filed: Jul. 14, 2000

(51) Int. Cl.[7] ................................ H01S 3/19
(52) U.S. Cl. .................. 372/50; 372/43; 372/44
(58) Field of Search .................. 372/50, 45, 46, 372/47, 49

(56) References Cited

U.S. PATENT DOCUMENTS

| | | | | |
|---|---|---|---|---|
| 4,675,877 A | * | 6/1987 | Svilans | 372/96 |
| 4,719,636 A | * | 1/1988 | Yamaguchi | 372/20 |
| 4,833,684 A | | 5/1989 | Krekels et al. | |
| 4,873,691 A | * | 10/1989 | Uomi et al. | 372/20 |
| 5,065,200 A | * | 11/1991 | Bhat et al. | 257/15 |
| 5,103,455 A | * | 4/1992 | Eichen et al. | 257/290 |
| 5,119,393 A | * | 6/1992 | Oka et al. | 372/102 |
| 5,177,758 A | | 1/1993 | Oka et al. | |
| 5,266,503 A | * | 11/1993 | Wang et al. | 148/DIG. 95 |
| 5,325,382 A | * | 6/1994 | Emura et al. | 372/26 |
| 5,497,391 A | * | 3/1996 | Paoli | 372/50 |
| 5,541,945 A | * | 7/1996 | Yamaguchi et al. | 372/20 |
| 5,581,572 A | | 12/1996 | Delorme et al. | |
| 6,026,108 A | * | 2/2000 | Lim et al. | 372/50 |

* cited by examiner

Primary Examiner—Paul Ip
Assistant Examiner—Dung T Nguyen
(74) Attorney, Agent, or Firm—Lowenstein Sandler PC

(57) ABSTRACT

An improved semiconductor laser (distributed feedback or Bragg reflector laser) is disclosed, having reducing wavelength chirping. In a laser having a substrate, an optical waveguide layer disposed on the substrate with a grating region, and a cladding region disposed on the optical waveguide layer, an isolation region is positioned in at least one of the substrate, optical waveguide layer, and cladding layer. The isolation region is comprised of a material adapted to increase the resistivity of the one or more layers in which it is placed to reduce electrical cross-talk and wavelength chirping. Preferably, the isolation region is positioned in at least the cladding layer, which the inventors have found is the greatest contributor of cross-talk and wavelength chirping.

11 Claims, 3 Drawing Sheets

APPARATUS AND METHOD FOR MINIMIZING WAVELENGTH CHIRP OF LASER DEVICES

FIELD OF THE INVENTION

The present invention relates to an integrated circuit device and more particularly, to a semiconductor laser having an isolation region for reducing wavelength chirp.

BACKGROUND OF THE INVENTION

Distributed feedback (DFB) and distributed Bragg reflector (DBR) lasers are light sources of choice in many optical communications systems. See, e.g., Loewen et al., DIFFRACTION GRATINGS AND APPLICATIONS (M. Dekker, NY 1997). Such lasers are designed to restrict laser oscillation to a single longitudinal mode with use of a diffraction grating provided in a semiconductor crystal.

For example, a typical DFB semiconductor laser includes a semiconductor substrate having a series of corrugated ridges formed thereon to define a grating; the grating reflects select wavelengths of light into the laser, and light at only one resonant wavelength is amplified. With the capability of oscillating light in a single, stable longitudinal mode, such devices are useful as light sources for coherent transmissions and in optical communications systems. Chromatic dispersion is minimized, and a signal emitted from the laser can be transported in an optical fiber over long distances.

In the distributed Bragg reflection (DBR) laser, the grating is etched outside the part of the laser that is pumped with electrical current. Current is driven into the laser at one region providing optical gain (external to the grating), and then pumped into the grating region to provide tuning. By separating the gain region from the tuning region in a DBR laser, increased tuning range can be provided from a DFB laser. However, the DBR works in much the same way as the DFB laser in that optical gain and grating feedback is needed for each.

For example, FIG. 1 is a schematic illustration of one configuration for a DBR laser. This laser comprises a semiconductor substrate 10 which can be viewed as comprising three regions, e.g., a modulation or phase control region 20, a tuning or distributed feedback (DFB) region 30, and an amplifier or gain region 40. An optical waveguide layer 12 is grown on the entire surface of the substrate 10, and thus, is shared by all sections. A diffraction grating 13 is provided in that part of the waveguide layer corresponding to the DBR region 30. An active layer 15 fabricated with semiconducting material may be formed contiguous the waveguide layer 12 for amplifying light. The active layer 15 typically is confined to the gain region 40 of the DBR laser, as shown, although it may be deposited adjacent the entire surface of the waveguide layer 12.

A cladding layer 14 is grown over the entire surface of the optical waveguide layer 12. Then, provided above the cladding layer 14 in each of the modulation 20, DBR 30, and gain regions 40 are top electrodes 22, 32, and 42, respectively. The cladding layer 14 is partially removed between the electrodes to define grooves 18, 19 for electrically isolating the top electrodes. A bottom electrode 16 is provided on the underside of the substrate and connected to common ground. An anti-reflection coating 24 is deposited at the modulation region and a reflecting facet coating 44 at the gain region. Typically, the anti-reflection coating 24 will allow for less than 1% reflection, more preferably less than 0.1%, and the reflection coating allows for reflection of from 30% to 99% or more, usually between 70% and 90% reflection.

In operation, current is injected into the laser from gain electrode 42 to excite electrons and stimulate the emission of light in waveguide layer 12. Since the waveguide layer has a relatively high index of refraction relative to the substrate 10 and cladding layer 14, light is guided along the high-index waveguide layer and reflected within the laser. Due to the presence of diffraction grating 13, only certain wavelengths of light will be reflected back into the laser, e.g., to gain region 40. This wavelength selectivity will depend upon the period of the diffraction grating 13. The wavelength response can be modulated by injecting current into the waveguide layer with tuning (DBR) electrode 32. The modulator electrode 22 may be activated to impress data upon the light beam. Various other configurations for DFB and DBR lasers are known and described in the field, see, e.g., U.S. Pat. No. 5,581,572 to Delorme et al., "Wavelength-Tunable Distributed Bragg Reflector Laser Having Selectively Activated, Virtual Diffraction Gratings"; U.S. Pat. No. 5,177,758 to Oka et al., "Semiconductor Laser Device with Plural Active Layers and Changing Optical Properties"; U.S. Pat. No. 4,719,636 to Yamaguchi, "Wavelength Tunable Semiconductor Laser Device Provided with Control Regions"; and U.S. Pat. No. 4,833,684 to Krekels et al., "Distributed Feedback Laser with Anti-Reflection Layer," each of which is incorporated herein by reference.

A drawback with such lasers relates to wavelength chirp. As described above, the light emitted from the laser may be directly modulated by changing the current passing through it, because a change in current alters the density of electrons in the laser. However, as the density of electrons changes, so does the refractive index of the materials comprising the laser, which effectively may change the optical length of the waveguide layer. Such fluctuations in wavelength due to changes in the refractive index of the materials comprising the laser is known as wavelength chirping. Wavelength chirping causes distortions in the pulse waveform of the emitted signal which can result in interference and/or limit the signal transmission distance.

As may be appreciated, those in the field of optical communications systems continue to seek new designs and components that increase efficiency, modulate more quickly, and exhibit higher performance than previous counterparts. There is particularly a need for a laser that minimizes wavelength chirping. This and further advantages of the instant invention may appear more fully upon considering the detailed description set forth below.

SUMMARY OF THE INVENTION

Summarily described, the invention embraces an improved semiconductor laser having a substrate, an optical waveguide layer disposed on the substrate with a grating region, and a cladding region disposed on the optical waveguide layer, wherein an isolation region is disposed in at least one of the substrate, optical waveguide layer, and cladding layer. The isolation region is comprised of a material adapted to increase the resistivity of the one or more layers in which it is placed for reducing electrical cross-talk and wavelength chirp. The isolation region may be fabricated with at least one of hydrogen, deuterium, helium, oxygen, and iron. Preferably, the isolation region is positioned in at least the cladding layer, which the inventors have found to be the greatest contributor of cross-talk and wavelength chirping.

BRIEF DESCRIPTION OF THE DRAWINGS

For a better understanding of the invention, an exemplary embodiment is described below, considered together with the accompanying drawings, in which:

FIGS. 4A and 4B are schematic illustrations of an electroabsorption modulated DBR laser having an isolation region, wherein FIG. 4A shows the region formed by ion implantation and FIG. 4B shows the region formed by epitaxial growth.

It is to be understood that these drawings are for the purposes of illustrating the concepts of the invention and are not to scale.

DETAILED DESCRIPTION OF THE INVENTION

Figure 1:
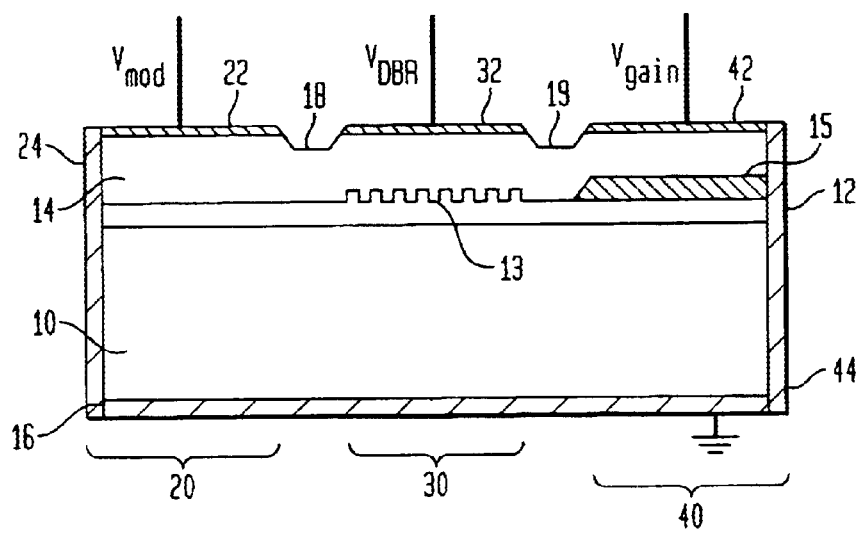
FIG. 1 is a schematic illustration of a prior art electroabsorption modulated DBR laser.

With this invention, an apparatus and method are provided for reducing adverse wavelength chirp of an electroabsorption modulated laser. As shown in FIG. 1, it is common that laser devices employ a shared substrate 10, shared waveguide 12, and shared cladding layer 14 between the laser sections which translates to a shared resistance to ground. The inventors have discovered that this common electrical resistance path and shared resistance results in electrical cross-talk between different sections of the tunable electroabsorption modulated laser and further, that this cross-talk contributes to an adverse wavelength chirp.

Applicants have discovered a laser configuration that minimizes electrical cross-talk, thus reducing the wavelength chirp. The laser configuration includes an isolation region between the modulator and tuning sections. The isolation region may be deposited by ion implantation or epitaxial growth. The shared cladding layer 14 is the biggest contributor to the cross-talk because of its high resistivity; thus, the isolation region advantageously is placed in the cladding layer. Although the substrate 10 is typically physically larger than the cladding layer, it contributes less to cross-talk due to its low resistivity. The invention contemplates placement of the isolation region in one or more, or a combination of, the shared substrate, waveguide, and/or cladding.

Figure 2:
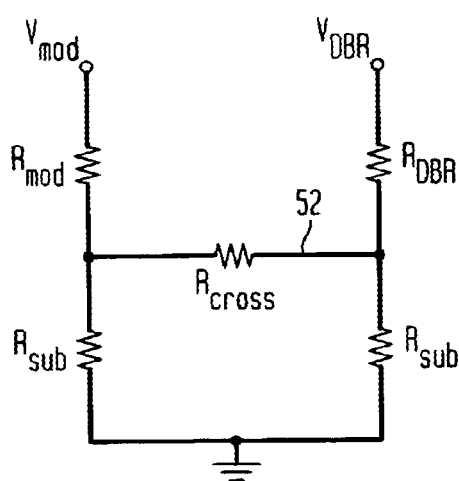
FIG. 2 is a simplified circuit diagram for an electroabsorption modulated DBR laser.
Figure 3:
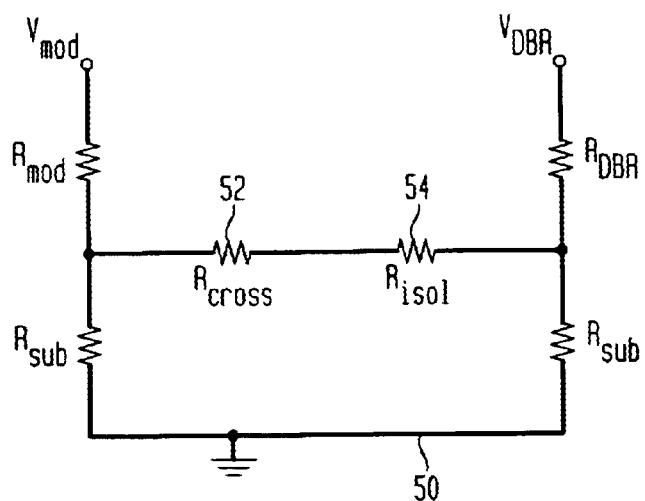
FIG. 3 is a circuit diagram for an electroabsorption modulated DBR laser having an isolation region according to the invention.

More particularly with reference to the figures, FIG. 2 is a simplified circuit diagram for the modulation and tuning (DBR) regions of an electroabsorption modulated DBR laser according to the prior art, as in FIG. 1. As can be seen, there is a shared common resistance. This shared resistance results in electrical cross-talk 52. Applicants have discovered that an "isolation region" may effectively reduce this cross-talk. For example, FIG. 3 shows the circuit diagram where an isolation region has been incorporated into the laser. The cross-talk 52 is still manifested, due to the shared resistance; however, the effects of the cross-talk are not realized or are substantially minimized due to additional resistance 54 generated by the isolation region.

Figure 4A:
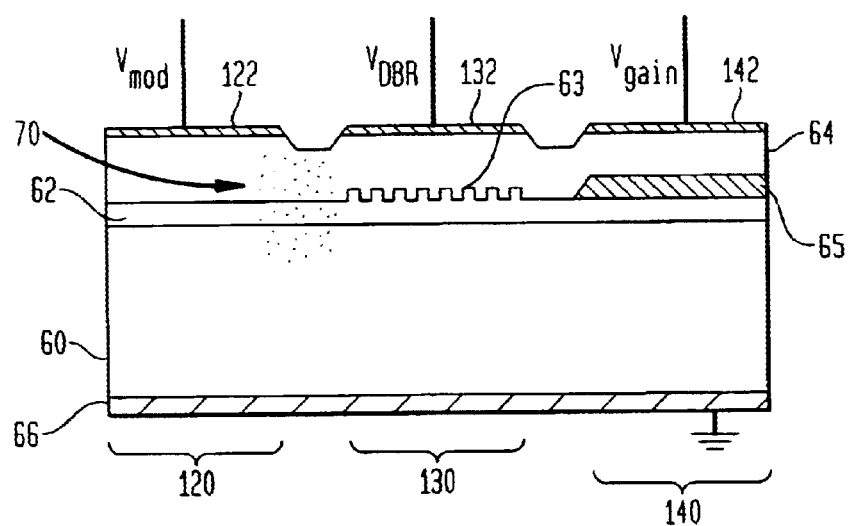
Figure 4B:
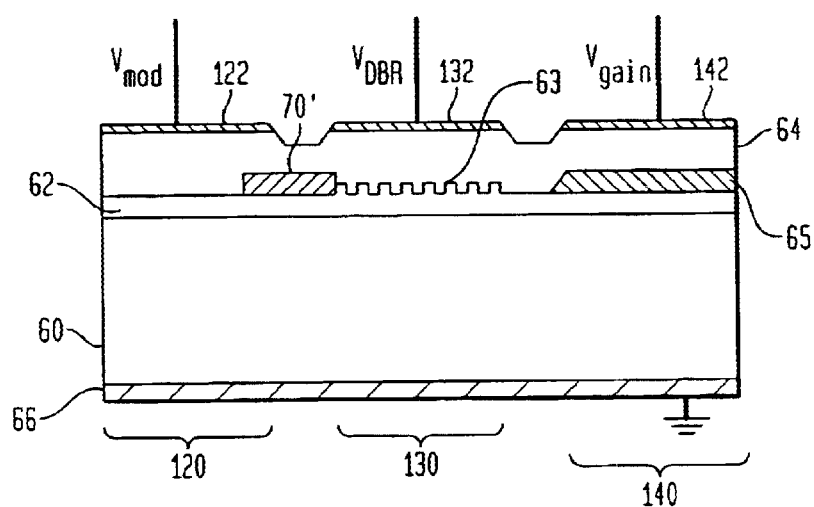

FIGS. 4A and 4B are schematic illustrations of an electroabsorption modulated DBR laser having an isolation region, wherein FIG. 4A shows the region formed by ion implantation and FIG. 4B shows the region formed by epitaxial growth. More particularly, in each of FIGS. 4A and 4B, the laser device has a common substrate 60 with a bottom electrode 66 on its underside. An optical waveguide layer 62 is disposed on the surface of the substrate for guiding emitted light. The waveguide layer has an axis of transmission that can be "divided" into three regions comprising a modulation region 120, a tuning region 130, and a gain region 140.

An active layer of semiconductor material 65 is disposed adjacent the optical waveguide layer at the gain region, as shown, although it may be disposed at other regions of the laser as well. The active layer is adapted for emitting light to the optical waveguide layer in response to the injection of carriers to the gain (and optionally another) region. A diffraction grating 63 is disposed in the optical waveguide layer at the tuning region 130 for feeding light having at least one specific wavelength back to the optical waveguide layer at the gain region. A gain electrode 122, tuning electrode 132, and a modulator electrode 142 adapted to inject current into the semiconductor laser at the gain, tuning, and modulation regions, respectively, are disposed on top of the laser, e.g., above cladding layer 64.

As shown, an isolation region 70 is disposed in the substrate between the tuning and modulation regions for reducing electrical cross-talk between the tuning and modulation regions. The isolation region is comprised of a resistivity-increasing material, that is, a material adapted for increasing resistivity in the layer in which it is positioned. The term "receiving layer" is used herein to refer to a layer receiving the resistivity-increasing material. The resistivity may be increased by passivation of dopants in the receiving layer and/or by damaging the receiving layer. By "damaging" the layer it is meant that crystal bonds are broken or atoms are displaced from their normal crystal positions causing electronic defect levels to be created deep within, in the forbidden gap, increasing material resistivity. Any material capable of generating a high resistivity in the receiving layer is contemplated as suitable for fabricating the isolation region. By "high resistivity" it is meant that the resistivity is sufficiently high that the resistivity between regions effectively prevents electrical crosstalk. Typically, a resistivity of about 1000 ohm-cm or more will achieve this function.

Typically, the DBR and DFB lasers will be fabricated with $In_xGa_{1-x}As_yP_{1-y}$ materials, lattice matched to InP. Suitable resistivity-generating implanted ions for fabricating the isolation region in such materials include hydrogen, deuterium, helium, oxygen and iron. Hydrogen and deuterium are preferred as these species increase resistivity with two mechanisms, i.e., by both damaging the device to create mid-gap electronic levels and by passivating existing dopants in device layers, e.g, p-dopants in cladding layer 14. Oxygen and iron are predominantly deep donors used as dopants and due to their high atomic mass are difficult to implant to the required depths in the crystal without deleteriously affecting the laser. Thus, oxygen and iron are less preferred.

In FIG. 4A, the isolation region 70 is formed by ion implantation, and thus, the isolation region may be deposited into the laser after the laser has been completely fabricated. The isolation region in this embodiment may comprise an ill-defined or shapeless region of implanted species disposed in at least one of the substrate 60, optical waveguide layer 62, or cladding layer 64 between the modulator 120 and tuning regions 130. The isolation region preferably is implanted at each of the substrate, waveguide, and cladding areas of the laser, although it can be implanted at only one of them and be effective.

As one skilled in the field may appreciate, the energy level and concentration of implanted species may be varied depending on the device structure, such as the thickness of the cladding layer, deepness of the grooves between the laser regions, the elements comprising the laser, and the particular species being implanted. Advantageously a range of energies is used in implanting the ions to obtain a profiled implantation. For example, nitrogen or neon ions may be implanted at the surface, and at a deeper region helium ions may be implanted using a range of energies of from 150 keV to 600 keV, with 1 to $7\times10^{13}$ or in some cases $10^{14}$ ions. If the structure is semi-insulating at its upper surface, the upper nitrogen or neon implantation may be omitted. The implantation will be tailored depending upon the design and depth of the device layers. A mask can be used to localize the implantation at the boundary region between the modulator and tuning regions. Those skilled in the field will appreciate that the photoresist mask (e.g., its composition and thickness), may be selected to achieved the desired implant depth and edge acuity. Typically for this application the photoresist mask will have a thickness in the range of about 1–2 microns. The implantation should be performed at temperatures that are sufficiently low so as not to affect device performance.

In FIG. 4B, the isolation region 70' comprises a layer that is grown by selective epitaxial overgrowth. In epitaxial overgrowth, single crystal material is grown from oxide-maskedt seed windows. As discussed above, advantageously the isolation region 70' is placed in the cladding layer 64, as shown, as this is the layer that provides the most substantial contribution to the cross-talk. The isolation region 70' may be formed by etching out a hole in the cladding layer 64 and then performing a masked selective epi step to fill in the hole with resistivity-generating materials, described above. Other areas of the waveguide can be etched and filled in with resistivity-generating materials. Alternatively, the isolation region 70' may be grown on the substrate 60 before the waveguide layer is deposited; above the waveguide layer 62, i.e., after the waveguide layer has been deposited, and before the cladding layer is deposited; or essentially at any point during the fabrication process. Reducing the cross-sectional area of the isolation region may increase the resistance generated thereby and provide a more effective device. Methods for performing epitaxial growth are known in the field.

It has been found that a laser fabricated with the isolation region according to the invention substantially reduces wavelength chirping. For example, with this invention, the semiconductor laser has minimal chirping. The chirping can be reduced by up to a factor of two as compared with typical devices. "Minimal chirping" as used herein means a fraction of 1 angstrom. There are many chirp characterizations, including peak-to-peak chirping and on-state chirping. Typical devices have peak-to-peak chirping of about 0.5 angstroms. With this invention, the peak-to-peak chirping can be reduced to below about 0.23 angstroms and on-state chirping can be reduced to less than about 0.1 angstroms. A reduction in chirp of about 40% or more may be achieved with a DBR version of the invention. Accordingly, with the invention higher speed (e.g., up to ~10 Gigabits or more) operations may be achieved over long distances (up to ~1 kilometer or more). In conventional electroabsorption modulated lasers, reduction in chirp has been sought by changing the transmission characteristics of the devices to be more negative; however, this results in a reduction of the power for transmissions. With this invention, chirp can be reduced without a concomitant reduction in power.

It is understood that the embodiments described herein are merely exemplary and that a person skilled in the art may make variations and modifications without departing from the spirit and scope of the invention. For example, although the invention is illustrated principally with reference to a distributed Bragg reflector laser with electroabsorption modulator, it may be applied to other devices such as an integrated electroabsorption modulated tunable laser, an integrated electroabsorption modulated laser, an integrated electroabsorption modulator, and other integrated optoelectronic devices. Also, one skilled in the field will appreciate that other components may be incorporated into the invention, e.g., an optical amplifier and/or detector may be included in the modulator, separated with an isolation region from the modulation region of the device. All such variations and modifications are intended to be included within the scope of the appended claims.

We claim:

1. An article including an improved semiconductor laser comprising a substrate, an optical waveguide layer disposed on the substrate having a grating region, and a cladding layer disposed on the optical waveguide layer, said semiconductor laser comprising: a gain region powered by a gain electrode, and at least one other region, including a grating or a modulator, and the at least one other region powered by an independent electrical current, wherein the improvement comprises an isolation region disposed in at least one of the substrate, optical waveguide layer, and the cladding layer to define at least one receiving layer, the isolation region being comprised of a material adapted to increase the resistivity of the at least one receiving layer to reduce electrical cross-talk and wavelength chirping while preserving the optical properties of the cladding layer.

2. The article of claim 1 in which the isolation region is fabricated with at least one of hydrogen, deuterium, helium, oxygen and iron.

3. The article of claim 1, in which the isolation region is disposed in the cladding layer.

4. The article of claim 1 in which the isolation region is deposited in the semiconductor laser by ion implantation.

5. The article of claim 1 in which the isolation region comprises a layer of material grown in the semiconductor layer by epitaxial growth.

6. An article including a semiconductor laser comprising:
   a substrate;
   an optical waveguide layer disposed on the surface of the substrate for guiding emitted light, the waveguide layer having an axis of transmission with three regions comprising a gain region, a tuning region, and a modulation region;
   an active layer of semiconductor material disposed adjacent the optical waveguide layer in at least the gain region, the active layer being adapted for emitting light to the optical waveguide layer in response to the injection of carriers to at least the gain region;
   a diffraction grating disposed in the optical waveguide layer at the tuning region for feeding light having at least one specific wavelength back to the optical waveguide layer at the gain region;
   a gain electrode, tuning electrode, and a modulator electrode adapted to inject current into the semiconductor laser at the gain region, tuning region, and modulation region, respectively,
   an isolation region disposed in at least one of the substrate, the cladding layer, and the waveguide layer for reducing electrical cross-talk and wavelength chirping.

7. The article of claim 6, in which the isolation region is disposed in the cladding layer.

8. The article of claim 6, in which the isolation region is disposed between the tuning and modulation regions.

9. The article of claim 6 in which the isolation region is deposited in the semiconductor laser by ion implantation.

10. The article of claim 6 in which the isolation region comprises a layer of material grown in the semiconductor laser by epitaxial growth.

11. The article of claim 1 in which the reduction in electrical cross-talk by the isolation region defines a semiconductor laser with minimal wavelength chirping.

* * * * *